(12) United States Patent
Oshima

(10) Patent No.: US 11,031,324 B2
(45) Date of Patent: Jun. 8, 2021

(54) SEMICONDUCTOR DEVICE

(71) Applicant: Mitsubishi Electric Corporation, Tokyo (JP)

(72) Inventor: Isao Oshima, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/570,183

(22) Filed: Sep. 13, 2019

(65) Prior Publication Data

US 2020/0185312 A1 Jun. 11, 2020

(30) Foreign Application Priority Data

Dec. 5, 2018 (JP) .............................. JP2018-227786

(51) Int. Cl.
*H01L 23/498* (2006.01)
*H01L 23/00* (2006.01)
*H01L 23/36* (2006.01)
*H01L 23/31* (2006.01)

(52) U.S. Cl.
CPC .. *H01L 23/49811* (2013.01); *H01L 23/49866* (2013.01); *H01L 24/06* (2013.01); *H01L 2224/0613* (2013.01); *H01L 2924/014* (2013.01); *H01L 2924/3511* (2013.01)

(58) Field of Classification Search
CPC ......... H01L 23/49811; H01L 23/49866; H01L 24/06; H01L 24/3511; H01L 2924/014; H01L 2224/0613; H01L 2224/29078; H01L 2224/29012; H01L 2224/29013; H01L 2224/29011
See application file for complete search history.

(56) References Cited

U.S. PATENT DOCUMENTS

2007/0217476 A1* 9/2007 Yoshikawa ............. H01L 24/32
372/66
2015/0123259 A1* 5/2015 Nakamura .......... H01L 23/3736
257/713

FOREIGN PATENT DOCUMENTS

JP 2015-015335 A 1/2015

* cited by examiner

*Primary Examiner* — Caridad Everhart
(74) *Attorney, Agent, or Firm* — Studebaker & Brackett PC

(57) ABSTRACT

A semiconductor device includes a substrate, a plurality of solders, and a semiconductor chip. The plurality of solders are located adjacent to each other. At least one of composition and concentration of the plurality of solders is different from each other. The semiconductor chip includes a joining surface to be joined to the substrate with the plurality of solders. The joining surface of the semiconductor chip includes a plurality of joining areas in which heat generation of the semiconductor chip or a stress on an object to be joined is different from each other. The plurality of solders are disposed to correspond to the plurality of joining areas, respectively.

12 Claims, 3 Drawing Sheets

SEMICONDUCTOR DEVICE

BACKGROUND OF THE INVENTION

Field of the Invention

The present invention relates to a semiconductor device including solders.

Description of the Background Art

Regarding power modules, semiconductor elements have been becoming thinner in order to achieve higher outputs and reduce losses. To properly thin semiconductor elements, it is essential that heat dissipation performance be controlled and reliability be enhanced. For example, in a technology of Japanese Patent Application Laid-Open No. 2015-015335, reliability is enhanced in the following manner. Specifically, thickness of solders is set different from each other depending on an area, and a thermal stress is thereby moderated.

However, depending on a design of a semiconductor device, thickness of solders may not be set different from each other. Further, when the thickness of solders is set different from each other, thickness of solders may be partially increased, which may result in reduction in heat dissipation performance.

The present invention is achieved in view of the problems as described above, and has an object to provide a technology capable of enhancing heat dissipation performance or reliability of a semiconductor device.

SUMMARY

The present invention is intended for a semiconductor device. The semiconductor device includes a substrate, a plurality of solders, and a semiconductor chip. The plurality of solders are disposed on the substrate, and are located adjacent to each other. At least one of composition and concentration of the plurality of solders is different from each other. The semiconductor chip includes a joining surface to be joined to the substrate with the plurality of solders. The joining surface of the semiconductor chip includes a plurality of joining areas in which heat generation of the semiconductor chip or a stress on an object to be joined is different from each other. The plurality of solders are disposed to correspond to the plurality of joining areas, respectively.

Heat dissipation performance or reliability of a semiconductor device can be enhanced.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
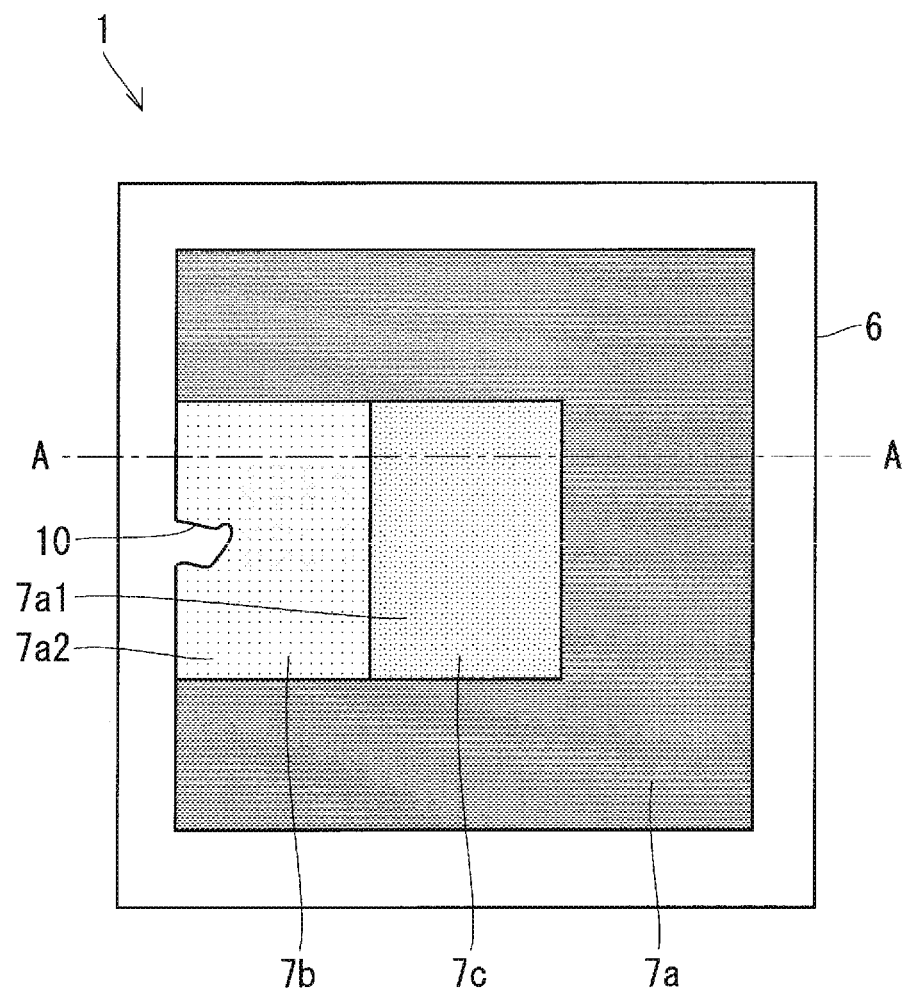
FIG. 1 is a plan view illustrating a configuration of a semiconductor device according to the first embodiment.
Figure 2:
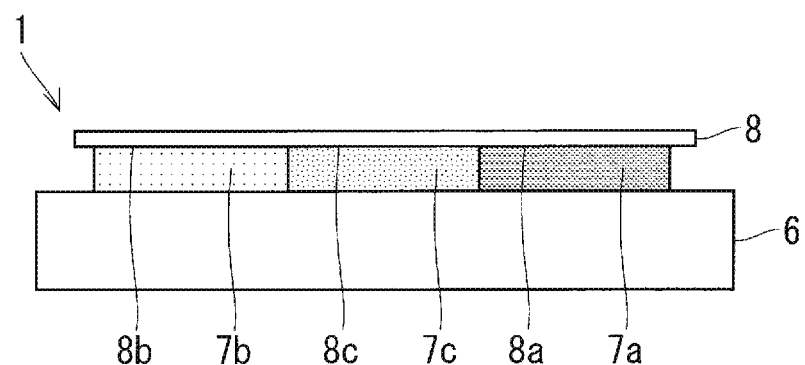
FIG. 2 is a cross-sectional view illustrating a configuration of the semiconductor device according to the first embodiment.

FIG. 1 is a plan view illustrating a configuration of a semiconductor device 1 according to a first embodiment of the present invention. FIG. 2 is a cross-sectional view taken along the line A-A of FIG. 1. As illustrated in FIG. 1 and FIG. 2, the semiconductor device 1 includes a substrate 6, a plurality of solders 7a, 7b, and 7c, and a semiconductor chip 8.

The plurality of solders 7a, 7b, and 7c are disposed on the substrate 6, and are located adjacent to each other. In the first embodiment, the plurality of solders 7a, 7b, and 7c include a first solder 7a, a second solder 7b, and a third solder 7c. The first solder 7a has a space 7a1 in which the first solder 7a is absent in plan view, and surrounds the space 7a1 in plan view except an opening 7a2 communicating to the space 7a1. The second solder 7b is disposed in the opening 7a2, and the third solder 7c is completely surrounded by the first solder 7a and the second solder 7b.

In the first embodiment, at least one of composition and concentration of the plurality of solders 7a, 7b, and 7c is different from each other. Here, a configuration in which composition of the plurality of solders 7a, 7b, and 7c is different from each other is described. A configuration in which concentration of the plurality of solders 7a, 7b, and 7c is different from each other will be described later. Note that composition and concentration of the first solder 7a itself are preferably uniform. The same also holds true for the second solder 7b and the third solder 7c.

In the configuration in which composition of the plurality of solders 7a, 7b, and 7c is different from each other, the plurality of solders 7a, 7b, and 7c contain antimony (Sb), nickel (Ni), bismuth (Bi), indium (In), and zinc (Zn) in combination different from each other. Generally, there is a tendency that mechanical strength and a solidification point of a solder containing bismuth and indium are lower than mechanical strength and a solidification point of a solder containing neither of those, though this tendency depends slightly on concentration and combination. In addition, generally, when a plurality of types of melting solders located adjacent to each other are cooled uniformly, there is a tendency that volumetric shrinkage is liable to be concentrated on a solder having a low solidification point (final solidification point), and that a shrinkage cavity 10 (FIG. 1) that deteriorates heat dissipation performance is liable to be generated.

In the first embodiment, the third solder 7c contains both bismuth and indium. The first solder 7a contains either bismuth or indium. The second solder 7b contains neither bismuth nor indium. Consequently, a shrinkage cavity is least liable to be generated in the third solder 7c, and thus the third solder 7c has the highest thermal conductivity. A shrinkage cavity is second least liable to be generated in the first solder 7a next to the third solder 7c, and thus the first solder 7a has the second highest thermal conductivity next to the third solder 7c. A shrinkage cavity is most liable to be generated in the second solder 7b, and thus the second solder 7b has the lowest thermal conductivity.

The semiconductor chip 8 includes a joining surface to be joined to the substrate 6 with the plurality of solders 7a, 7b, and 7c. This joining surface includes a plurality of joining areas 8a, 8b, and 8c in which heat generation of the semiconductor chip 8 is different from each other. The plurality of joining areas 8a, 8b, and 8c includes a first joining area 8a, a second joining area 8b, and a third joining area 8c.

The plurality of solders 7a, 7b, and 7c are disposed to correspond to the plurality of joining areas 8a, 8b, and 8c of the semiconductor chip 8, respectively. In the first embodiment, heat generation of the third joining area 8c corresponding to the third solder 7c is the highest. Heat generation of the first joining area 8a corresponding to the first solder 7a is the second highest, next to heat generation of the third joining area 8c. Heat generation of the second joining area 8b corresponding to the second solder 7b is the lowest. Consequently, a solder less liable to generate a shrinkage cavity and having high heat dissipation performance is disposed in a joining area having high heat generation. A solder more liable to generate a shrinkage cavity and having low heat dissipation performance is disposed in a joining area having low heat generation. Therefore, according to the first embodiment, heat dissipation performance of the semiconductor device 1 can be enhanced.

Note that, when a solder less liable to generate a shrinkage cavity and having high heat dissipation performance is used for all of the plurality of solders 7a, 7b, and 7c, a probability that a shrinkage cavity is generated in the first solder 7a requiring high heat dissipation performance, not in the second solder 7b, is increased. In contrast, in the first embodiment, a solder more liable to generate a shrinkage cavity and having low heat dissipation performance is used for the second solder 7b. When a shrinkage cavity is generated in the second solder 7b, volumetric shrinkage in the first solder 7a can be reduced. Therefore, a probability that a shrinkage cavity is generated in the first solder 7a requiring high heat dissipation performance can be reduced.

The configuration in which composition of the plurality of solders 7a, 7b, and 7c is different from each other has been described in the above. Next, a configuration in which concentration of the plurality of solders 7a, 7b, and 7c is different from each other is described. In the configuration in which concentration of the plurality of solders 7a, 7b, and 7c is different from each other, the plurality of solders 7a, 7b, and 7c contain copper (Cu) or silver (Ag), and concentration of copper or silver of the plurality of solders 7a, 7b, and 7c is different from each other by 0.5% or more. Generally, there is a tendency that higher concentration of copper or silver contained in a solder further increases thermal conductivity of a solder.

In the first embodiment, concentration of copper or silver of the third solder 7c is the highest. Concentration of copper or silver of the first solder 7a is the second highest, next to concentration of copper or silver of the third solder 7c. Concentration of copper or silver of the second solder 7b is the lowest. Consequently, out of the plurality of solders 7a, 7b, and 7c, thermal conductivity of the third solder 7c is the highest. Thermal conductivity of the first solder 7a is the second highest, next to thermal conductivity of the third solder 7c. Thermal conductivity of the second solder 7b is the lowest. Even with this configuration, similarly to the configuration described above, a solder less liable to generate a shrinkage cavity and having high heat dissipation performance is disposed in a joining area having high heat generation. A solder more liable to generate a shrinkage cavity and having low heat dissipation performance is disposed in a joining area having low heat generation. Therefore, heat dissipation performance of the semiconductor device 1 can be enhanced.

Note that, in the configuration described above, one of composition and concentration of the plurality of solders 7a, 7b, and 7c is different from each other. However, the plurality of solders 7a, 7b, and 7c may have a configuration that both composition and concentration of the plurality of solders 7a, 7b, and 7c are different from each other. Even in such a configuration, heat dissipation performance of the semiconductor device 1 can be enhanced, similarly to the configuration described above.

Second Embodiment

Figure 3:
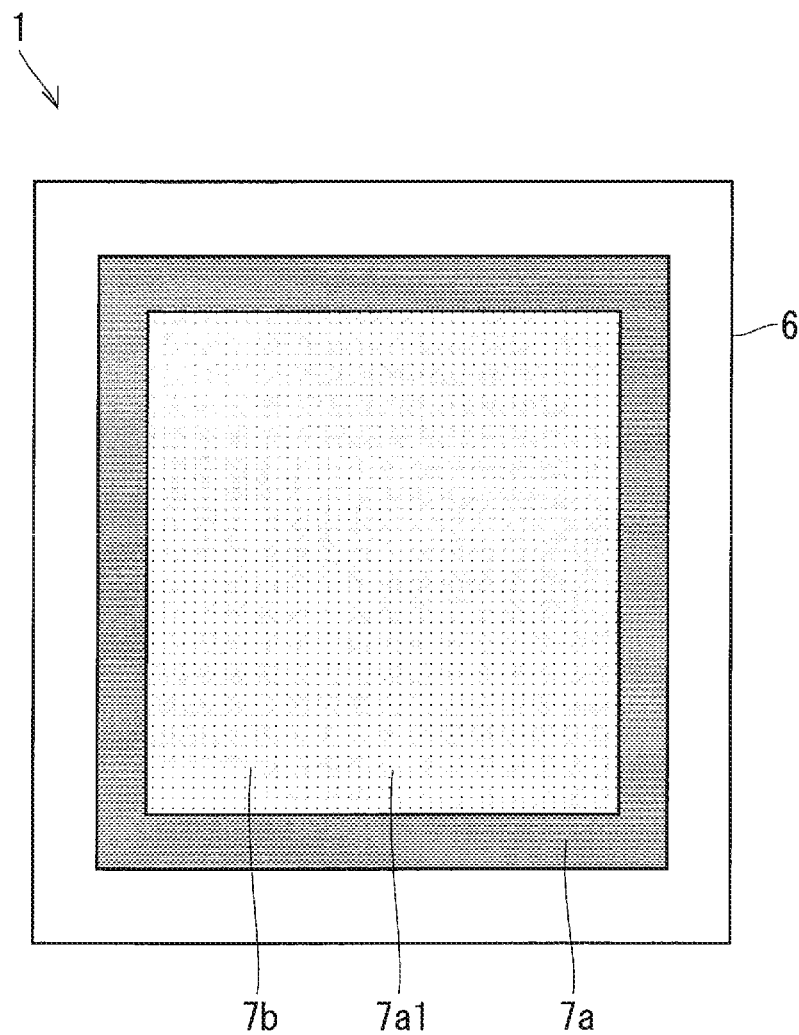
FIG. 3 is a plan view illustrating a configuration of the semiconductor device according to a second embodiment.

FIG. 3 is a plan view illustrating a configuration of the semiconductor device 1 according to a second embodiment of the present invention. In the following, among components of the second embodiment, components identical or similar to the components described above are denoted by the same reference signs, and components different from the components described above will be mainly described.

In the second embodiment, the plurality of solders 7a and 7b include a first solder 7a and a second solder 7b. The first solder 7a has a space 7a1 in which the first solder 7a is absent in plan view, and surrounds the space 7a1 in plan view. The second solder 7b is disposed in the space 7a1. Composition and concentration of the first solder 7a itself are preferably uniform. The same also holds true for the second solder 7b.

In the second embodiment, similarly to the first embodiment, at least one of composition and concentration of the plurality of solders 7a and 7b is different from each other. As a result, a solidification point of the first solder 7a is higher than a solidification point of the second solder 7b, due to the reason described in the first embodiment. Further, mechanical strength of the first solder 7a is higher than mechanical strength of the second solder 7b, and thermal conductivity of the second solder 7b is higher than thermal conductivity of the first solder 7a.

Figure 4:
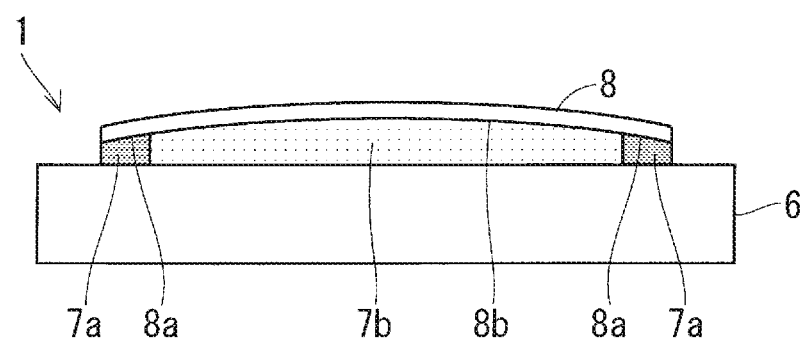
FIG. 4 is a cross-sectional view illustrating a configuration of the semiconductor device according to the second embodiment.

FIG. 4 is a cross-sectional view illustrating a state of the semiconductor device 1 before the first solder 7a and the second solder 7b are solidified. As illustrated in FIG. 4, the semiconductor chip 8 is warped in a curving manner to project toward a side opposite to the plurality of solders 7a and 7b.

According to the configuration of the semiconductor device 1 of the second embodiment as described above, the whole periphery of the second solder 7b is surrounded by the first solder 7a having a solidification point higher than that of the second solder 7b. According to such a configuration, when the semiconductor device 1 is formed, the second solder 7b having a low solidification point is solidified while being enclosed by the first solder 7a having high solidification point and thus being solidified first. Consequently, volumetric shrinkage of the second solder 7b having a low solidification point is reduced, and thus generation of a shrinkage cavity (a void) in the second solder 7b can be reduced. Further, an amount of volume corresponding to the shrinkage is cancelled out by the warpage of the semiconductor chip 8, and thus warpage of the semiconductor chip 8 can also be reduced. Further, thermal resistance can be reduced owing to such reduction of warpage.

As a result of the above, a joining surface of the semiconductor chip 8 includes a plurality of joining areas 8a and 8b having a stress on an object to be joined different from each other, i.e., a first joining area 8a and a second joining area 8b. In the second embodiment, the plurality of solders 7a and 7b are disposed to correspond to the plurality of joining areas 8a and 8b of the semiconductor chip 8, respectively. For example, the first joining area 8a allows a first stress to be applied to the first solder 7a corresponding to the first joining area 8a. The second joining area 8b allows a second stress different from the first stress to be applied to the second solder 7b corresponding to the second joining area 8b. The second stress may be smaller than the first stress, or the first stress may be smaller than the second stress. According to such a configuration, heat dissipation performance of the semiconductor device 1 can be enhanced as described above.

Further, in the second embodiment, the first solder 7a and the second solder 7b having different mechanical strengths are selectively disposed in the first joining area 8a and the second joining area 8b having different stresses, respectively. Further, for example, a relationship between magnitudes of mechanical strengths of the first solder 7a and the second solder 7b may accord with a relationship between magnitudes of stresses of the first joining area 8a and the second joining area 8b. According to such a configuration, a lateral crack of a solder can be reduced, and therefore reliability of the semiconductor device 1 can be enhanced. Note that this configuration can also be implemented in the first embodiment.

Further, in the second embodiment, the first solder 7a and the second solder 7b having different thermal conductivities are selectively disposed in the first joining area 8a and the second joining area 8b having different stresses, respectively. Further, for example, a relationship between magnitudes of thermal conductivities of the first solder 7a and the second solder 7b may accord with a relationship between magnitudes of stresses of the first joining area 8a and the second joining area 8b. According to such a configuration, heat dissipation performance of a central part of the semiconductor chip 8 having large heat generation can be enhanced, and therefore reliability of the semiconductor device 1 can be further enhanced. Note that this configuration can also be implemented in the first embodiment.

<Modification>

In the description above, disposition of solders as in FIG. 1 is applied to a plurality of joining areas in which heat generation of the semiconductor chip 8 is different from each other. However, disposition of solders as in FIG. 3 may be applied to the joining areas. Similarly, in the above, disposition of solders as in FIG. 3 is applied to a plurality of joining areas in which a stress on an object to be joined is different from each other. However, disposition of solders as in FIG. 1 may be applied to the joining areas.

Further, in the description above, disposition of solders as in FIG. 1 is applied to a plurality of joining areas in which heat generation of the semiconductor chip 8 is different from each other. However, disposition of solders as in FIG. 1 may be applied to a combination of a plurality of joining areas in which heat generation of the semiconductor chip 8 is different from each other and a plurality of joining areas in which a stress on an object to be joined is different from each other. Similarly, in the above, disposition of solders as in FIG. 3 is applied to a plurality of joining areas in which heat generation of the semiconductor chip 8 is different from each other. However, disposition of solders as in FIG. 3 may be applied to a combination of a plurality of joining areas in which heat generation of the semiconductor chip 8 is different from each other and a plurality of joining areas in which a stress on an object to be joined is different from each other.

Figure 5:
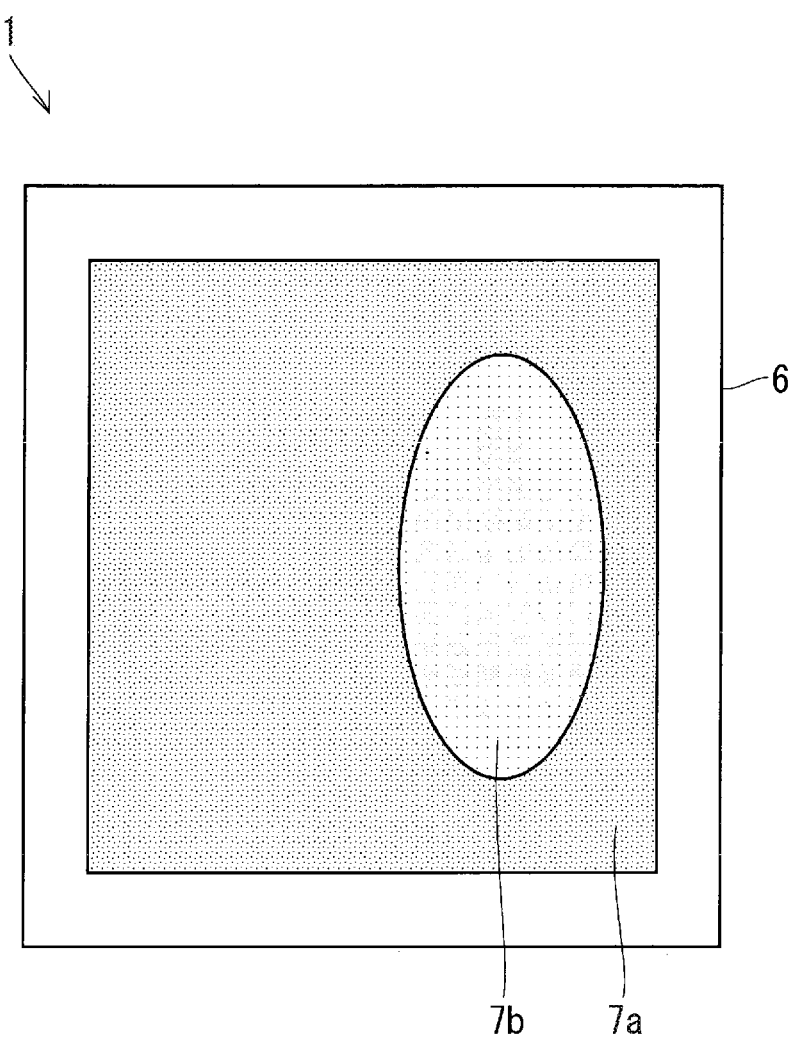
FIG. 5 is a plan view illustrating a configuration of the semiconductor device according to a modification.

Further, in the description above, the shape of a solder in plan view is a quadrilateral shape. However, the shape may be a polygonal shape other than the quadrilateral shape, and may be a circular shape or an elliptic shape as in FIG. 5.

Note that, in the present invention, each embodiment and each modification may be freely combined, or each embodiment and each modification may be modified or omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
a substrate;
a plurality of solders disposed on the substrate; including a first solder, a second solder, and a third solder; and located adjacent to each other, at least one of composition and concentration of the plurality of solders being different from each other; and
a semiconductor chip including a joining surface to be joined to the substrate with the plurality of solders, wherein
the joining surface of the semiconductor chip includes a plurality of joining areas in which heat generation of the semiconductor chip or a stress on an object to be joined is different from each other,
the plurality of solders are disposed to correspond to the plurality of joining areas, respectively,
the first solder has a central space in which the first solder is absent in plan view, and surrounds the space in plan view except an opening communicating to the space,
the second solder is disposed in the opening, and
the third solder is disposed in the space to directly contact each of the first solder and the second solder.

2. A semiconductor device comprising:
a substrate;
a plurality of solders disposed on the substrate, and located adjacent to each other, at least one of composition and concentration of the plurality of solders being different from each other; and
a semiconductor chip including a joining surface to be joined to the substrate with the plurality of solders,
the joining surface of the semiconductor chip includes a plurality of joining areas in which heat generation of the semiconductor chip or a stress on an object to be joined is different from each other,
the plurality of solders are disposed to correspond to the plurality of joining areas, respectively,
the plurality of solders include a first solder and a second solder,
the first solder has a space in which the first solder is absent in plan view, and surrounds the space in plan view,
the second solder is disposed in the space,
a solidification point of the first solder is higher than a solidification point of the second solder, and
the plurality of joining areas include:
a first joining area corresponding to the first solder, and allowing a first stress to be applied to the first solder; and
a second joining area corresponding to the second solder, and allowing a second stress different from the first stress to be applied to the second solder.

3. The semiconductor device according to claim 1, wherein
the plurality of joining areas include a first joining area and a second joining area having different stresses, and the first solder and the second solder having different mechanical strengths are selectively disposed in the first joining area and the second joining area, respectively.

4. The semiconductor device according to claim 1, wherein
the plurality of joining areas include a first joining area and a second joining area having different stresses, and
the first solder and the second solder having different thermal conductivities are selectively disposed in the first joining area and the second joining area, respectively.

5. The semiconductor device according to claim 1, wherein
the plurality of solders contain copper or silver, and
concentration of copper or silver of the plurality of solders is different from each other by 0.5% or more.

6. The semiconductor device according to claim 1, wherein
the plurality of solders contain antimony, nickel, bismuth, indium, and zinc in combination different from each other.

7. A semiconductor device comprising:
a substrate;
a plurality of solders disposed on the substrate, the plurality of solders including a first solder and a second solder being located adjacent to each other, at least one of composition and concentration of the plurality of solders being different from each other; and
a semiconductor chip including a joining surface to be joined to the substrate with the plurality of solders, wherein
the joining surface of the semiconductor chip includes a plurality of joining areas in which heat generation of the semiconductor chip or a stress on an object to be joined is different from each other, and
the plurality of solders are disposed to correspond to the plurality of joining areas, respectively,
the first solder has a space in which the first solder is absent in plan view, the space having a center being located at a position away from a center of the first solder, and surrounds the space in plan view, and
the second solder is disposed in the space.

8. The semiconductor device according to claim 7, wherein
a solidification point of the first solder is higher than a solidification point of the second solder, and
the plurality of joining areas include:
a first joining area corresponding to the first solder, and allowing a first stress to be applied to the first solder; and
a second joining area corresponding to the second solder, and allowing a second stress different from the first stress to be applied to the second solder.

9. The semiconductor device according to claim 8, wherein
the plurality of joining areas include a first joining area and a second joining area having different stresses, and
the first solder and the second solder having different mechanical strengths are selectively disposed in the first joining area and the second joining area, respectively.

10. The semiconductor device according to claim 8, wherein
the plurality of joining areas include a first joining area and a second joining area having different stresses, and
the first solder and the second solder having different thermal conductivities are selectively disposed in the first joining area and the second joining area, respectively.

11. The semiconductor device according to claim 7, wherein
the plurality of solders contain copper or silver, and
concentration of copper or silver of the plurality of solders is different from each other by 0.5% or more.

12. The semiconductor device according to claim 7, wherein
the plurality of solders contain antimony, nickel, bismuth, indium, and zinc in combination different from each other.

* * * * *